United States Patent [19]

Hanoka

[11] 4,047,986

[45] Sept. 13, 1977

[54] EPITAXIAL FILM FORMATION OF A LIGHT EMITTING DIODE AND THE PRODUCT THEREOF

[75] Inventor: Jack Isaac Hanoka, Highland Park, N.J.

[73] Assignee: Integrated Display Systems, Inc., Edison, N.J.

[21] Appl. No.: 684,587

[22] Filed: May 10, 1976

[51] Int. Cl.$^2$ ............................................ H01L 21/208
[52] U.S. Cl. .................................. 148/171; 148/1.5; 148/33; 148/172
[58] Field of Search ................. 148/171, 1.5, 172, 33; 252/62.3 GA

[56] References Cited

U.S. PATENT DOCUMENTS

| | | | |
|---|---|---|---|
| 3,533,856 | 10/1970 | Panish et al. | 148/1.5 |
| 3,546,032 | 12/1970 | Basart | 148/171 |
| 3,665,888 | 5/1972 | Bergh et al. | 148/171 X |
| 3,967,987 | 7/1976 | Jones et al. | 148/171 |

Primary Examiner—G. Ozaki
Attorney, Agent, or Firm—David S. Woronoff

[57] ABSTRACT

The preparation of a semiconductor substrate for epitaxial deposition and the deposition of a solution from which the epitaxial film is formed is carried out at room temperature. The solution is deposited on the condensing surface in two discrete layering operations, the first of which ensures complete wetting of the condensing surface, the second of which ensures junction formation at a prescribed depth. The procedure is particularly useful in forming P Type epitaxial films on N-Type gallium phosphide substrates.

8 Claims, 1 Drawing Figure

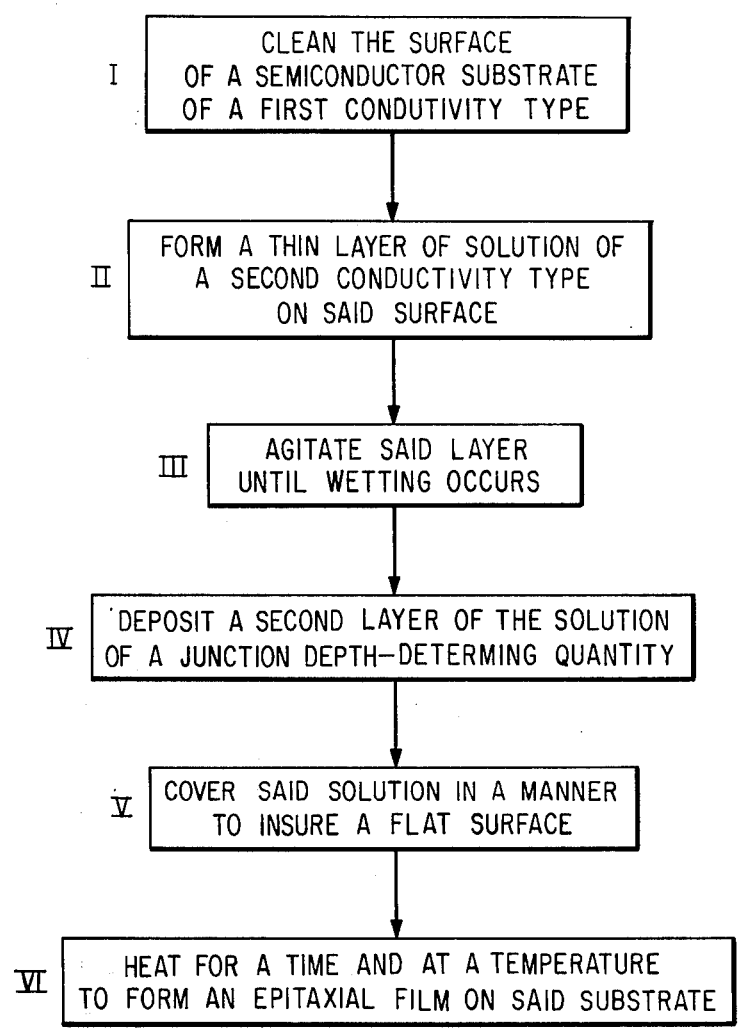

EPITAXIAL FILM FORMATION OF A LIGHT EMITTING DIODE AND THE PRODUCT THEREOF

FIELD OF THE INVENTION

The invention relates to the preparation of epitaxial semiconductor films, and more particularly to a method for preparing doped epitaxial films for defining large area rectifying junctions of controlled depth in said substrates.

BACKGROUND OF THE INVENTION

Epitaxial deposition of semiconductor films on single crystal semiconductor substrates is well known. Although a variety of techniques for forming such films is known, liquid phase techniques are most pertinent to the present invention. Common to liquid phase epitaxy techniques (LPE) is the preparation of a melt of the semiconductor material which is brought into contact with the condensing surface of the substate. It is common also to clean the condensing surface and to coat the surface with a wetting agent prior to the exposure of the surface to the melt.

When it is required to form a broad area rectifying junction between the epitaxial film and the substrate, the melt is doped with impurities of a conductivity type opposite to that of the substrate. For n-type conductivity gallium arsenide in particular, p-type conductivity films are required and these films have been difficult to form uniformly over the entire area of substrates of available size. Thus, junctions of varying depths are formed in the substrates resulting in diodes of nonuniform properties.

In one type of liquid phase epitaxy technique, a measured amount of doped solution is contained in a well which is brought into contact with the condensing surface at an elevated temperature. The junction in this case is formed at a depth determined by the original depth of the solution in the well. Unfortunately, in this technique, as well as in other LPE techniques, nonuniformities in the junction depths as well as voids are formed. The problems are particularly acute in the formation of large area P-type epitaxial films for gallium arsenide light emitting diodes where low yields and quality are the rule. To be specific, nonuniformity of junction depth and the occurrence of voids at which no junction is formed at all during epitaxial deposition of p-type films on N-type gallium arsenide occurred because of the lack of uniform wetting of the condensing surface by the solution from which the film is formed.

BRIEF DESCRIPTION OF THE INVENTION

The invention is based on the recognition that a thin layer of a suitable p-type solution can be deposited on a cleaned and treated deposition surface and mechanically agitated until total wetting of the condensing surface is visually observed. The remainder of the P-type solution to a depth determinative of the desired junction depth is deposited onto the thin layer. Since the layers of solution are of like materials, complete wetting and proper depth of junctions are achieved with high yield.

The procedure is enhanced by the preparation of the solution by thermal agitation at an elevated temperature for formation of the layers in situ at about room temperature. The so prepared substrates are encompassed by a ring on an inert boat and covered by a flat surface which flattens the surface of the solution. The wafers are then heated to a temperature and for a time to form the epitaxial film.

BRIEF DESCRIPTION OF THE FIGURE

The FIGURE shows a block diagram illustrating the steps used in an embodiment of the present invention.

DESCRIPTION OF THE PREFERRED EMBODIMENT OF THE INVENTION

The present invention relates to a method of forming by epitaxial growth a semiconductor device and to the device formed by the method.

The method employed is to prepare a semiconductor substrate of one type for deposition of a semiconductor material of the other type, i.e., a first substrate and a first deposition. The first substrate may be of either $p$ type or $n$ type. The invention is more useful for $p$ type substrates because it has been more difficult to work with $n$ type dopants until the present invention.

A first deposition material or dopant is prepared. If the substrate were gallium phosphide, a dopant mixture of liquid gallium, zinc, tin and gallium oxide might be prepared. The dopant is kept warm on a hot plate at a temperature of about 85° F—the melt temperature of gallium. Such a dopant is stable and workable at room temperature of about 70° Fahrenheit.

The substrate would be cleaned (as illustrated by numeral I in the FIGURE) and placed in a chamber which is kept at room temperature and pressure and totally enclosed. A first dopant mixture will be brought into contact with the substrate (as shown by numeral II in the FIGURE) and mechanically agitated so that the substrate is visually seen to be totally wetted (as illustrated by numeral III in the FIGURE). Total wetting may be seen when the first dopant appears as a reflecting surface. The first dopant layer is essentially of minimum thickness necessary to ensure complete wetting of the substrate, say $x$ mils.

The first dopant mixture is then brought into contact with the now wetted substrate (as shown in number IV in the drawing) and a thicker layer of $y$ mils is formed on the substrate. The first dopant mixture is again mechanically agitated too and its equal distribution on the wetted substrate achieved. Where a final 1 to 3 mil layer (i.E. 0.001 to 0.003 of an inch) is desired, the second layer may be about 20 mils thick (i.e. 0.020 of an inch). Y is much thicker than $x$ the final rectifying junction thickness may be said to be z mils.

A cover is placed over the dopant mixture deposited on the substrate so that the dopant mixture will be flat on the substrate (as illustrated by numeral V in the FIGURE). The cover may be made of quartz.

The treated substrate in placed in an oven and heated in accordance with a predetermined temperature and time schedule to form the epitaxial semiconductor (as shown by numeral VI in the FIGURE).

Two layers can by grown simultaneously in accordance with the present invention by wetting a second substrate with the dopant mixture and placing it over the treated first substrate or by treating the first substrate on its previously untreated side as in the earlier steps.

The semiconductor device formed from this method has a uniform and predictable thickness with essentially a planar interface, i.e., without peaks and valleys of one type of semiconductor material. The presence of a planar interface instead of the sawtooth interface gives semiconductor devices a greater performance predictability and a greater yield of devices from a particular substrate. The yield from a given size substrate increased 50%. Using the present inventive method it has been found not necessary to clean the substrate with an etch as is commonly done. The first dopant acts as a cleaning agent by thoroughly wetting the substrate.

What is claimed is:

1. A method for forming an epitaxial film for a light emitting diode on a single crystal substrate of semiconductor material of a first conductivity type;

said method comprising the steps of clea ning the surface of said substrate;

coating said surface with a thin layer of a first solution from which an epitaxial film of a second conductivity type can be formed; wherein said first solution was formed at an elevated temperature, stored in a vessel at slightly above room temperature and applied at normal room temperature;

agitating said thin layer in a manner and for a time to ensure complete wetting of said surface by said layer;

adding to said thin layer a second measure of said first solution from said storage vessel to form a second layer of solution substantially thicker than said first layer for determining the depth of a rectifying junction formed in said substrate during a subsequent heating step;

and heating said coated substrate at a temperature and for a time to form an epitaxial layer.

2. A method in accordance with claim 1 in which said substrate comprises n-conductivity type gallium phosphide and said first solution comprises a solution of gallium and p-conductivity type impurities.

3. A method in accordance with claim 2 in which said impurities comprise zinc and gallium oxide.

4. A method in accordance with claim 2 in which said impurities comprise tin and gallium oxide.

5. A method in accordance with claim 2 wherein said depth of said rectifying junction in $Z$ mils, said first layer has a thickness $x$ mils, and said second layer has a thickness $y >> x$ Mils.

6. A method in accordance with claim 1 in which said step of ceaning comprises:

coating said surface with a thin layer of a first solution from which an epitaxial film of a second conductivity type can be formed.

7. A method in accordance with claim 6 in which said step of agitating comprises mechanical stirring for a time to cause said layer to appear reflecting.

8. A semiconductor diode made by the method of claim 2, wherein is formed a broad area rectifying junction.

* * * * *